United States Patent
Hazue

(10) Patent No.: US 10,818,686 B2
(45) Date of Patent: Oct. 27, 2020

(54) SEMICONDUCTOR MEMORY DEVICE INCLUDING A PILLAR-SHAPED CHANNEL PENETRATING A STACKED BODY

(71) Applicant: TOSHIBA MEMORY CORPORATION, Minato-ku (JP)

(72) Inventor: Shunsuke Hazue, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/296,529

(22) Filed: Mar. 8, 2019

(65) Prior Publication Data
US 2020/0075619 A1 Mar. 5, 2020

(30) Foreign Application Priority Data
Sep. 5, 2018 (JP) .................................. 2018-165579

(51) Int. Cl.
| | |
|---|---|
| H01L 27/11 | (2006.01) |
| G11C 16/10 | (2006.01) |
| H01L 27/11578 | (2017.01) |
| H01L 27/11565 | (2017.01) |
| H01L 21/762 | (2006.01) |
| G11C 16/04 | (2006.01) |

(52) U.S. Cl.
CPC ........ *H01L 27/11578* (2013.01); *G11C 16/10* (2013.01); *H01L 21/76224* (2013.01); *H01L 27/11565* (2013.01); *G11C 16/0483* (2013.01)

(58) Field of Classification Search
CPC ......... H01L 27/11578; H01L 27/11565; G11C 16/10
See application file for complete search history.

(56) References Cited

U.S. PATENT DOCUMENTS

| | | | | |
|---|---|---|---|---|
| 9,349,747 B2 * | 5/2016 | Kim | .................. | H01L 27/11556 |
| 9,576,969 B2 * | 2/2017 | Manorotkul | ...... | H01L 27/11526 |
| 9,595,346 B2 * | 3/2017 | Lee | ......................... | H01L 29/04 |
| 9,659,959 B2 * | 5/2017 | Lee | .................. | H01L 27/11573 |
| 9,691,782 B1 * | 6/2017 | Hwang | ............. | H01L 27/11565 |

(Continued)

FOREIGN PATENT DOCUMENTS

| | | |
|---|---|---|
| JP | 5279560 | 9/2013 |
| JP | 2016-058552 | 4/2016 |

(Continued)

*Primary Examiner* — Ida M Soward
(74) *Attorney, Agent, or Firm* — Oblon, McClelland, Maier & Neustadt, L.L.P.

(57) ABSTRACT

According to one embodiment, a semiconductor memory device includes: a substrate; a first conductive layer arranged above the substrate; a stacked body arranged on the first conductive layer with a plurality of dielectric layers and a plurality of second conductive layers being alternately stacked; a pillar-shaped channel extending in a stacking direction of the stacked body, penetrating through the stacked body, and protruding into the first conductive layer; and a memory layer covering a side surface of the channel, in which a bottom surface of the channel and the side surface of the channel protruding into the first conductive layer are in contact with the first conductive layer, and in which the first conductive layer includes: an upper layer; and a lower layer having a protrusion penetrating through the upper layer.

10 Claims, 9 Drawing Sheets

(56) References Cited

U.S. PATENT DOCUMENTS

| | | | | |
|---|---|---|---|---|
| 9,716,181 | B2* | 7/2017 | Nam | H01L 29/78672 |
| 9,799,672 | B2* | 10/2017 | Son | H01L 27/0688 |
| 9,960,181 | B1* | 5/2018 | Cui | H01L 27/11556 |
| 10,026,750 | B1* | 7/2018 | Lai | G11C 16/10 |
| 10,163,924 | B2* | 12/2018 | Ahn | H01L 21/31 |
| 10,262,945 | B2* | 4/2019 | Makala | H01L 23/535 |
| 10,283,452 | B2* | 5/2019 | Zhu | H01L 23/522 |
| 10,325,775 | B2* | 6/2019 | Sung | H01L 27/11565 |
| 10,381,373 | B2* | 8/2019 | Okizumi | H01L 27/11578 |
| 10,431,595 | B1* | 10/2019 | Yang | H01L 27/11565 |
| 10,446,570 | B2* | 10/2019 | Lee | G11C 16/08 |
| 10,522,228 | B2* | 12/2019 | Tanaka | H01L 27/11565 |
| 10,559,577 | B2* | 2/2020 | Yun | H01L 27/11556 |
| 10,559,582 | B2* | 2/2020 | Nishikawa | H01L 27/11529 |
| 10,573,659 | B2* | 2/2020 | Oh | H01L 27/11556 |
| 10,622,369 | B2* | 4/2020 | Zhou | H01L 27/11548 |
| 2010/0232224 | A1 | 9/2010 | Maeda et al. | |
| 2011/0019480 | A1* | 1/2011 | Kito | H01L 27/11565 365/185.18 |
| 2013/0009235 | A1 | 1/2013 | Yoo | |
| 2015/0099338 | A1 | 4/2015 | Yoo | |
| 2015/0303209 | A1* | 10/2015 | Park | H01L 27/11565 257/316 |
| 2016/0071741 | A1 | 3/2016 | Imamura et al. | |
| 2017/0243650 | A1* | 8/2017 | Ogawa | H01L 27/11556 |
| 2017/0271349 | A1 | 9/2017 | Miyagawa et al. | |
| 2017/0294443 | A1* | 10/2017 | Kim | H01L 27/11573 |
| 2017/0330887 | A1* | 11/2017 | Kim | H01L 27/11565 |
| 2017/0352678 | A1* | 12/2017 | Lu | H01L 21/4846 |
| 2017/0352680 | A1* | 12/2017 | Shin | H01L 23/535 |
| 2017/0373084 | A1* | 12/2017 | Shim | H01L 27/11565 |
| 2018/0005698 | A1 | 1/2018 | Ueno et al. | |
| 2018/0122819 | A1* | 5/2018 | Shim | H01L 27/11521 |
| 2018/0358374 | A1* | 12/2018 | Kim | H01L 27/1157 |
| 2019/0006381 | A1* | 1/2019 | Nakatsuji | H01L 27/11565 |
| 2019/0051599 | A1* | 2/2019 | Zhang | H01L 27/11565 |
| 2019/0057741 | A1* | 2/2019 | Ogawa | H01L 23/5226 |
| 2019/0081069 | A1* | 3/2019 | Lu | H01L 27/11582 |
| 2019/0214407 | A1* | 7/2019 | Lee | H01L 23/528 |
| 2019/0319100 | A1* | 10/2019 | Chen | H01L 27/11524 |

FOREIGN PATENT DOCUMENTS

| | | |
|---|---|---|
| JP | 6095908 | 3/2017 |
| JP | 2017-174866 | 9/2017 |
| JP | 2018-005961 | 1/2018 |
| WO | WO 2018/038786 A1 | 3/2018 |

* cited by examiner

FIG.3A1
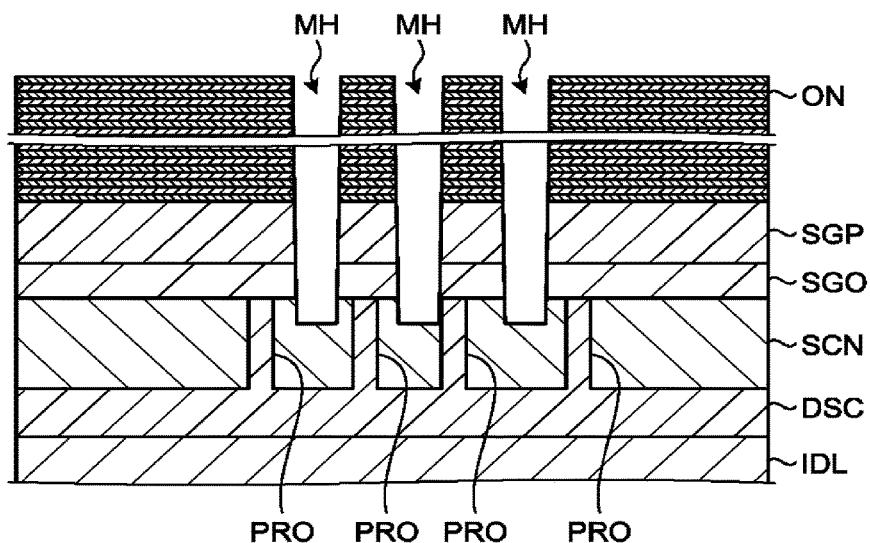
FIG.3A2
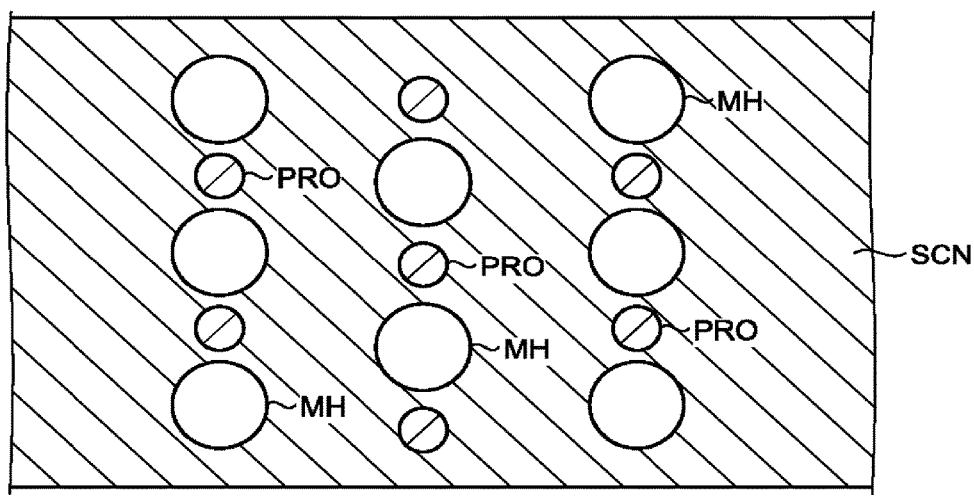
FIG.3B
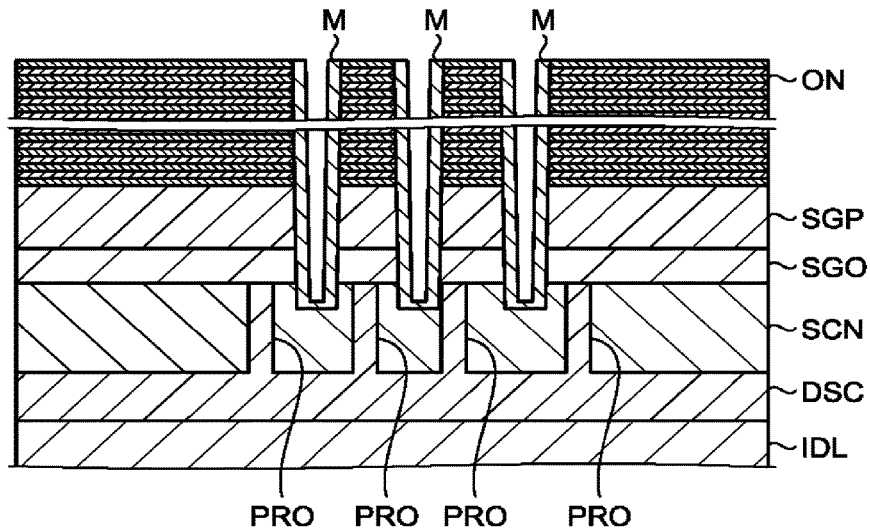

SEMICONDUCTOR MEMORY DEVICE INCLUDING A PILLAR-SHAPED CHANNEL PENETRATING A STACKED BODY

CROSS-REFERENCE TO RELATED APPLICATIONS

This application is based upon and claims the benefit of priority from Japanese Patent Application No. 2018-165579, filed on Sep. 5, 2018; the entire contents of which are incorporated herein by reference.

FIELD

Embodiments described herein relate generally to a semiconductor memory device and a method of manufacturing a semiconductor memory device.

BACKGROUND

A three-dimensional nonvolatile memory has a structure in which a pillar-shaped channel extending in the height direction is covered with a memory layer, so that a plurality of memory cells are arranged along the height direction of the channel. How to connect the channel covered with the memory layer to a source line in a lower layer of the channel becomes an issue.

BRIEF DESCRIPTION OF THE DRAWINGS

FIG. 3A1 is a cross-sectional view illustrating an example of the procedure of the processes of manufacturing the semiconductor memory device according to the embodiment;

FIG. 3A2 is a cross-sectional view illustrating an example of the procedure of the processes of manufacturing the semiconductor memory device according to the embodiment;

FIG. 3B is a cross-sectional view illustrating an example of the procedure of the processes of manufacturing the semiconductor memory device according to the embodiment;

DETAILED DESCRIPTION

A semiconductor memory device according to an embodiment includes: a substrate; a first conductive layer arranged above the substrate; a stacked body arranged on the first conductive layer with a plurality of dielectric layers and a plurality of second conductive layers being alternately stacked; a pillar-shaped channel extending in a stacking direction of the stacked body, penetrating through the stacked body, and protruding into the first conductive layer; and a memory layer covering a side surface of the channel, in which a bottom surface of the channel and the side surface of the channel protruding into the first conductive layer are in contact with the first conductive layer, and in which the first conductive layer includes: an upper layer; and a lower layer having a protrusion penetrating through the upper layer.

Hereinafter, the present invention will be described in detail with reference to the drawings. In addition, the present invention is not limited by the following embodiments. In addition, components in the following embodiments include those that can be easily assumed by those skilled in the art or those that are substantially the same.

The semiconductor memory device according to the embodiment will be described with reference to FIGS. 1 to 9B.

[Configuration Example of Semiconductor Memory Device]

Figure 1:
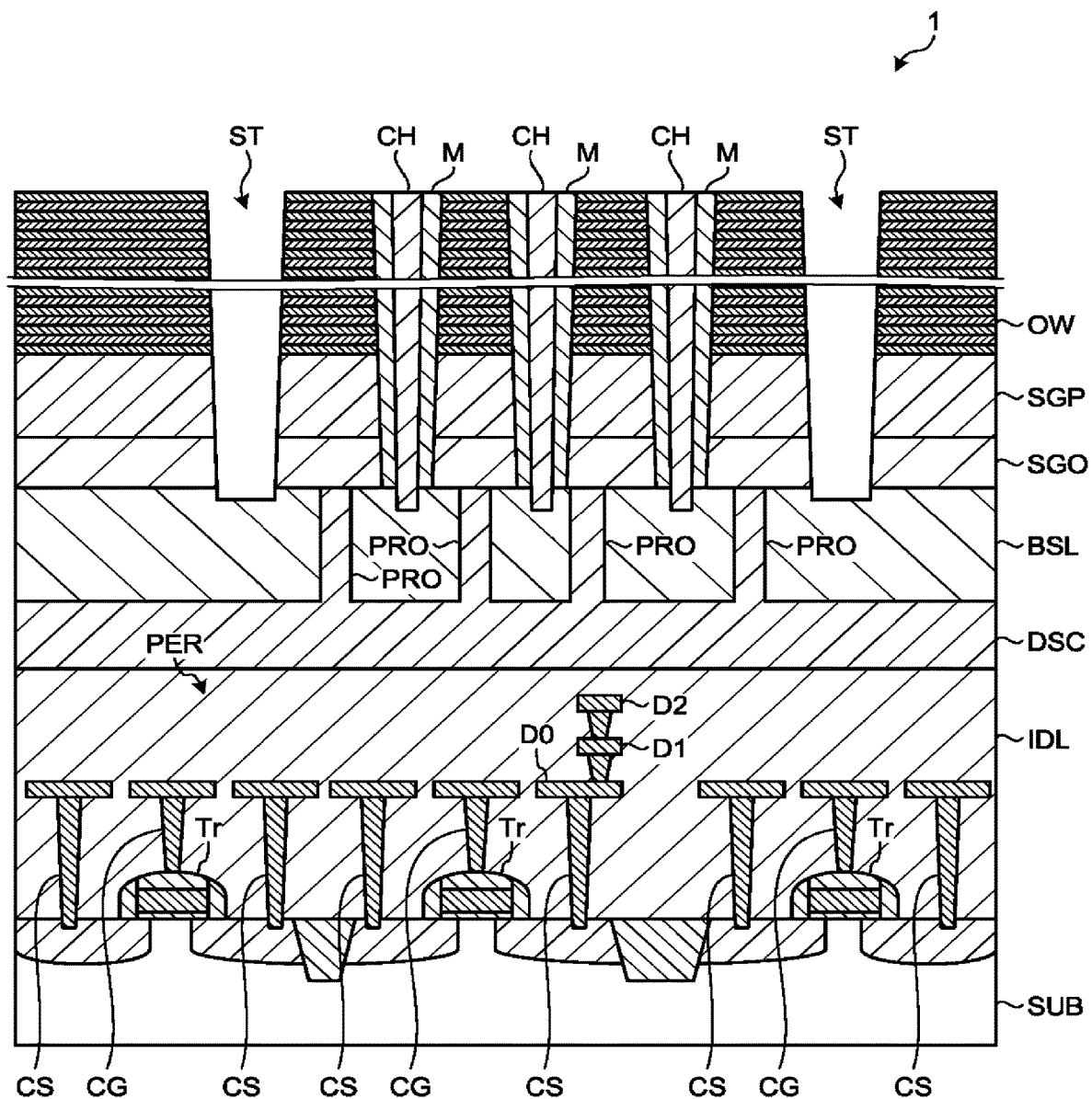
FIG. 1 is a cross-sectional view of a semiconductor memory device according to an embodiment in a stacking direction.

FIG. 1 is a cross-sectional view of a semiconductor memory device 1 according to the embodiment in the stacking direction thereof. The semiconductor memory device 1 according to the embodiment is formed as, for example, a NAND type flash memory having a three-dimensional structure.

As illustrated in FIG. 1, the semiconductor memory device 1 includes a peripheral circuit PER arranged on a semiconductor substrate SUB such as a silicon substrate. The peripheral circuit PER includes transistors Tr, gate contacts CG, source/drain contacts CS, wire lines D0 to D2, and the like. The transistor Tr is configured as, for example, a complementary metal oxide semiconductor (CMOS) transistor. This structure is covered with an interlayer dielectric layer IDL. The peripheral circuit PER functions as a circuit for operating memory cells included in the semiconductor memory device 1.

A conductive layer DSC and a conductive layer BSL on the conductive layer DSC are arranged above the peripheral circuit PER. The conductive layer DSC has protrusions PRO penetrating through the conductive layer BSL. The protrusion PRO is a pillar-shaped structure having, for example, a circular shape in a top view. The conductive layers DSC and BSL are made of polysilicon or the like into which, for example, impurities are implanted. The amounts of impurities implanted into the conductive layers DSC and BSL may be different from each other.

A conductive layer SGP is arranged on the conductive layer BSL with interposing a dielectric layer SGO. The dielectric layer SGO is made of, for example, $SiO_2$ or the like. The conductive layer SGP is made of polysilicon or the like into which, for example, impurities are implanted. The amount of impurities implanted into the conductive layer SGP may be different from those of the conductive layers DSC and BSL.

A stacked body OW in which a plurality of dielectric layers and a plurality of conductive layers are alternately stacked is arranged on the conductive layer SGP. The dielectric layer is made of, for example, $SiO_2$ or the like. The conductive layer is made of, for example, tungsten or the like.

A plurality of pillar-shaped channels CH are provided in the stacked body OW so as to penetrate through the stacked body OW. The lower ends of the individual channels CH reach the conductive layer BSL and protrude into the conductive layer BSL. In addition, it is preferable that the individual channels CH are arranged at positions where bottom surfaces of the channels CH do not completely overlap with the upper surfaces of the protrusions PRO of the conductive layer DSC. In other words, the bottom surfaces of the channels CH and the upper surfaces of the protrusions PRO may partially overlap with each other.

The channel CH has a pillar-shaped core portion. The core portion is made of, for example, $SiO_2$ or the like. In a portion other than the core portion, the channel CH is made of, for example, silicon or the like. The silicon constituting the channel CH is, for example, amorphous silicon, polysilicon, or the like.

A memory layer M is provided on a side surface of the channel CH excluding the portion protruding into the conductive layer BSL. The memory layer M includes, for example, a tunnel dielectric layer, a charge storage layer, and a block dielectric layer from the channel CH side. The charge storage layer is made of, for example, SiN or the like, and the tunnel dielectric layer and the block dielectric layer are made of, for example, $SiO_2$ or the like.

The core portion included in the channel CH has, for example, a circular or elliptical shape in a top view, and thus, the entire structure including the memory layer M becomes a pillar-shaped structure having a circular or elliptical cross section. It is desirable that the diameter of the bottom surface of the structure including the entire memory layer M is larger than the diameter of the upper surface of the protrusion PRO included in the conductive layer DSC.

Outside the region of the stacked body OW in which the plurality of channels CH are provided, slits ST are provided so as to penetrate through the stacked body OW. The lower end of the slit ST reaches the conductive layer BSL. In other words, the stacked body OW, the conductive layer SGP, and the dielectric layer SGO are separated into both sides of the slit ST by the slit ST. In addition, it is desirable that the width of the bottom surface of the slit ST has, for example, a numerical value larger than the height of the protrusion PRO included in the conductive layer DSC.

The inside of the slit ST may be buried with a dielectric material. As another form, the side surfaces of the slits ST may be covered with a dielectric material, and the slits ST of the inside of the dielectric material may be buried with a conductive material so as to function as wire lines.

The function of the semiconductor memory device 1 as a three-dimensional NAND type flash memory will be described.

At least a portion of the channel CH penetrating through the stacked body OW and the memory layer M having the tunnel dielectric layer, the charge storage layer, and the block dielectric layer functions as memory cells. The memory cells are arranged at the height positions of the conductive layer in the stacked body OW. That is, in the pillar-shaped channel CH, a plurality of memory cells are arranged along the height direction of the channel CH. These memory cells function as a memory string continuing to the side surface of one channel CH.

The plurality of conductive layers included in the stacked body OW function as word lines connected to the memory cells in at least at a portion in contact with the side surface of the memory layer M and in the vicinity thereof. Each of the memory cells is associated with the respective conductive layer (word line) at the same height.

The conductive layer SGP functions as a selection gate line for selecting a predetermined memory string from a plurality of memory strings. The channel, the tunnel dielectric layer, the charge storage layer, and the block dielectric layer associated with the selection gate line function as the selection gate. When the selection gate is turned on or off, a predetermined memory string is in a selected state or in a non-selected state.

The conductive layers DSC and BSL function as source lines connected to the channel CH. As described above, the lower end of the channel CH, that is, the side surface and the bottom surface of the portion protruding to the conductive layer BSL of the channel CH do not have the memory layer M but are in contact with the conductive layer BSL. Therefore, it is possible to acquire electrical conduction between the channel CH and the conductive layers DSC and BSL.

In addition, a conductive layer (not illustrated) is arranged above the memory cell and functions as a bit line connected to the channel CH.

[Processes of Manufacturing Semiconductor Memory Device]

Next, an example of processes of manufacturing the semiconductor memory device 1 will be described with reference to FIGS. 2A to 6C. FIGS. 2A to 6C are cross-sectional views illustrating an example of the procedure of the processes of manufacturing the semiconductor memory device 1 according to the embodiment. In FIGS. 2A to 6C, a peripheral circuit PER of the lower layer of the conductive layer DSC is omitted. The peripheral circuit PER including the transistor Tr can be manufactured by general processes of manufacturing a semiconductor device including, for example, a transistor.

Figure 2A:
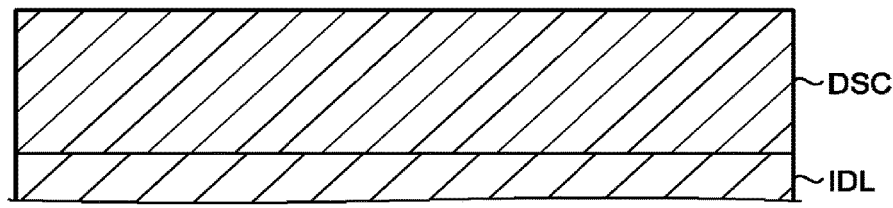
FIG. 2A is a cross-sectional view illustrating an example of a procedure of processes of manufacturing the semiconductor memory device according to the embodiment.

As illustrated in FIG. 2A, the conductive layer DSC is formed on the interlayer dielectric layer IDL covering the peripheral circuit PER. At this time, the thickness of the conductive layer DSC is set to the thickness including the protrusion PRO to be formed later.

Figure 2B:
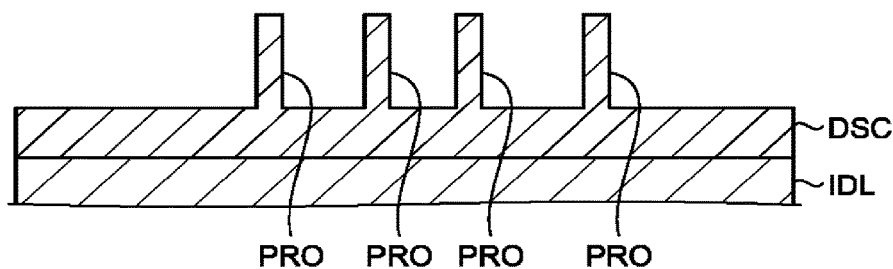
FIG. 2B is a cross-sectional view illustrating an example of the procedure of the processes of manufacturing the semiconductor memory device according to the embodiment.

As illustrated in FIG. 2B, the protrusions PRO are formed on the conductive layer DSC. The protrusions PRO can be formed, for example, by forming a dot-shaped resist pattern (not illustrated) on the conductive layer DSC and half-etching the conductive layer DSC down to the middle of the thickness. After the conductive layer DSC is etched, slimming of the protrusions PRO may be performed by further wet etching or the like.

Figure 2C:
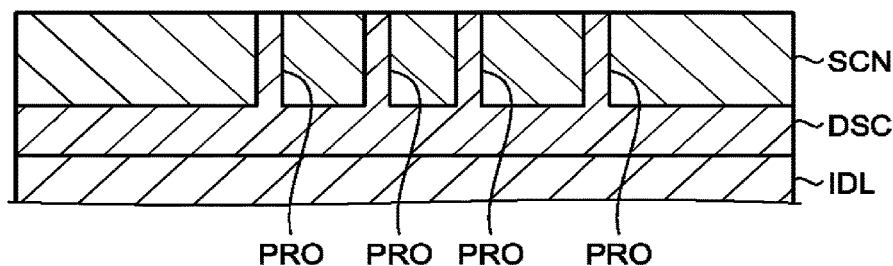
FIG. 2C is a cross-sectional view illustrating an example of the procedure of the processes of manufacturing the semiconductor memory device according to the embodiment.

As illustrated in FIG. 2C, a sacrificial layer SCN is formed on the conductive layer DSC so as to bury the protrusions PRO except a top surface thereof. The sacrificial layer SCN is a dielectric layer that can be replaced with polysilicon or the like to constitute the conductive layer BSL later and is made of, for example, SiN or the like.

Figure 2D:
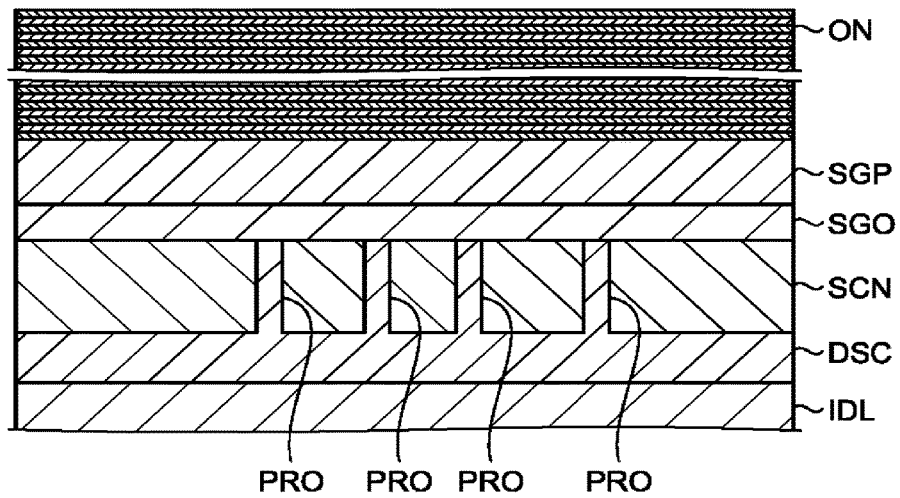
FIG. 2D is a cross-sectional view illustrating an example of the procedure of the processes of manufacturing the semiconductor memory device according to the embodiment.

As illustrated in FIG. 2D, the dielectric layer SGO, the conductive layer SGP, and a stacked body ON in which a plurality of dielectric layers and sacrificial layers are alternately stacked are formed on the sacrificial layer SCN and the top surface of the protrusions PRO. The sacrificial layer constituting the stacked body ON is a dielectric layer that can be replaced with tungsten or the like to constitute the conductive layer of the stacked body OW later and is made of, for example, SiN or the like.

As illustrated in FIG. 3A1, a plurality of memory holes MH are formed so as to penetrate through the stacked body ON. The lower end of each memory hole MH reaches the sacrificial layer SCN and protrudes into the sacrificial layer SCN. In addition, it is preferable that the diameter of the bottom surface of the memory hole MH is larger than the diameter of the upper surface of the protrusion PRO. The memory holes MH are formed at positions where the channels CH are to be provided later.

More specifically, the memory holes MH and the protrusions PRO of the conductive layer DSC are alternately arranged in a top view, as illustrated in the cross-sectional view in the direction along the semiconductor substrate SUB in FIG. 3A2. In this manner, it is preferable that the memory holes MH and the protrusions PRO are arranged at positions not overlapping with each other. However, misalignment of the memory holes MH with the protrusions PRO may occur, and the memory holes MH and the protrusions PRO may partially overlap with each other.

As illustrated in FIG. 3B, the memory layers M are formed on the inner walls of the memory holes MH. The memory layer M can be formed by depositing the block dielectric layer, the charge storage layer, and the tunnel dielectric layer in this order from the inner wall surface side of the memory hole MH. Therefore, the memory layer M is formed on the entire surface of the inner wall surface and the bottom surface of the memory hole MH.

Figure 4A:
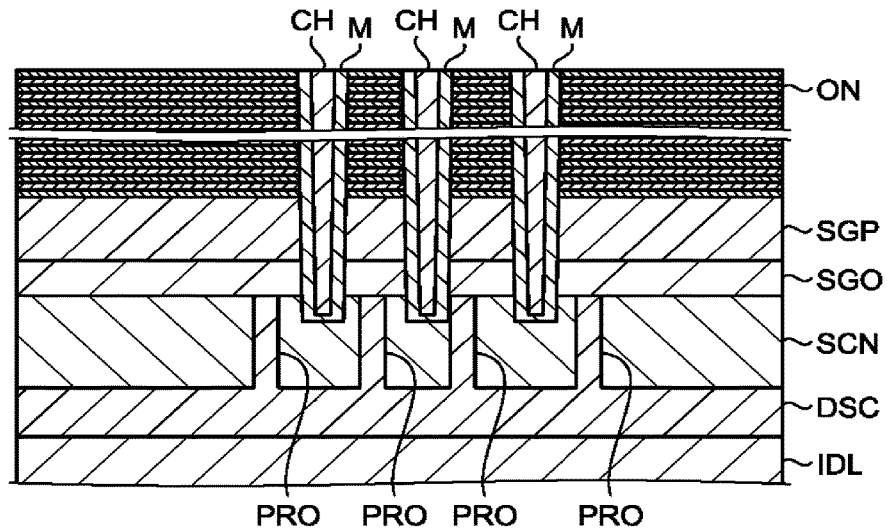
FIG. 4A is a cross-sectional view illustrating an example of the procedure of the processes of manufacturing the semiconductor memory device according to the embodiment.

As illustrated in FIG. 4A, the channels CH are formed on the inner walls of the memory layers M. The channel CH can be formed by forming a silicon layer on the entire surface of the inner wall surface and the bottom surface of the memory layer M and filling the void remaining at the end of the memory hole MH with $SiO_2$ or the like as a core portion. Therefore, the channel CH in which the side surface and the bottom surface are covered with the memory layer M is formed.

Figure 4B:
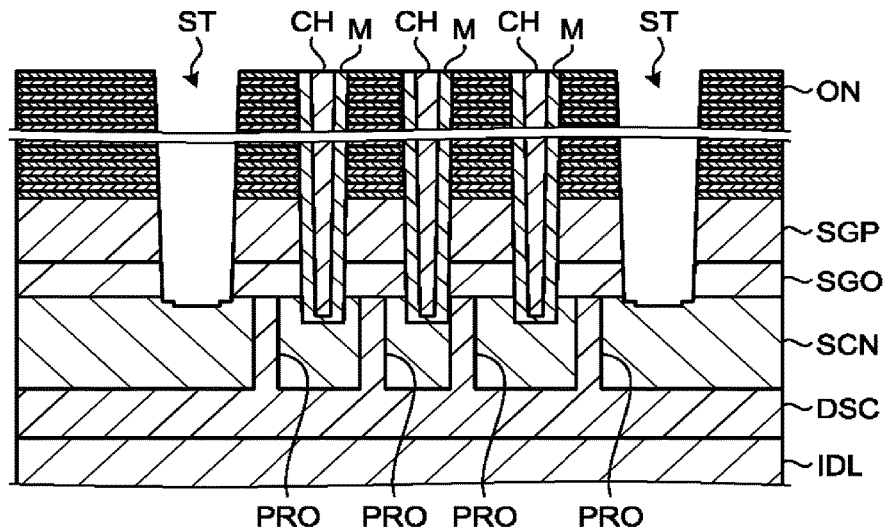
FIG. 4B is a cross-sectional view illustrating an example of the procedure of the processes of manufacturing the semiconductor memory device according to the embodiment.

As illustrated in FIG. 4B, slits ST are formed so as to penetrate through the stacked body ON outside the region of the stacked body ON in which a plurality of channels CH are formed. The lower ends of the slits ST reach the sacrificial layer SCN. At this time, it is desirable that the width of the bottom surface of the slit ST is formed so as to have, for example, a numerical value larger than the height of the protrusion PRO included in the conductive layer DSC.

Figure 4C:
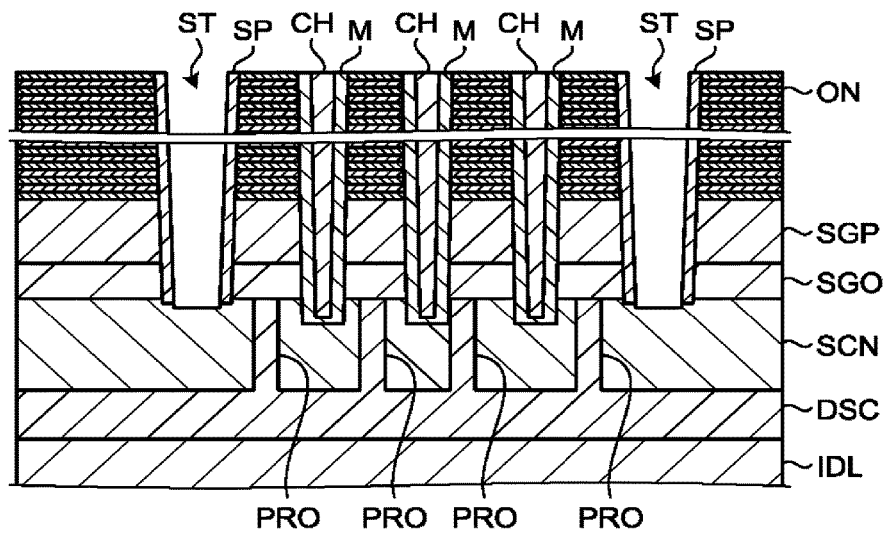
FIG. 4C is a cross-sectional view illustrating an example of the procedure of the processes of manufacturing the semiconductor memory device according to the embodiment.

As illustrated in FIG. 4C, spacer layers SP are formed on the inner walls of the slits ST. The spacer layer SP can be formed by depositing a dielectric material. The spacer layer SP is a dielectric layer made of a material different from the dielectric layer constituting the sacrificial layer SCN and is made of, for example, $SiO_2$ or the like.

Figure 5A:
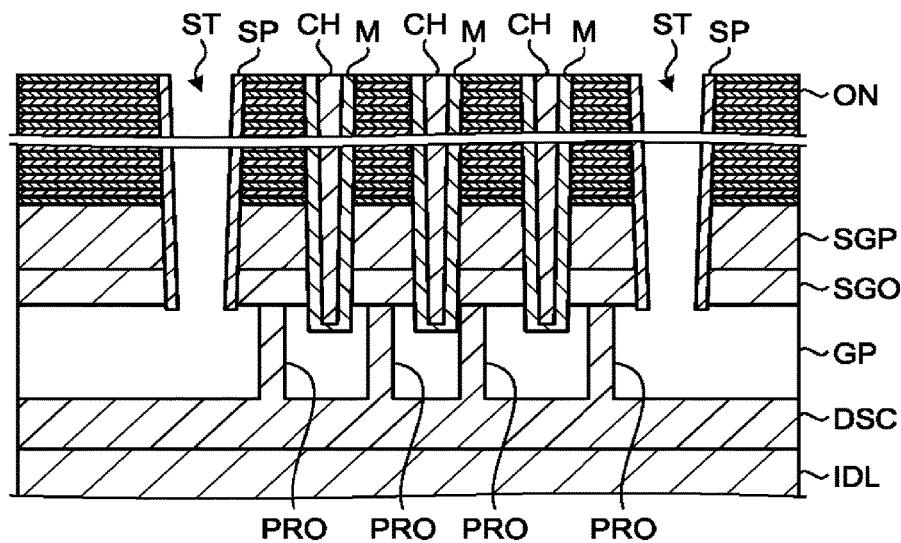
FIG. 5A is a cross-sectional view illustrating an example of the procedure of the processes of manufacturing the semiconductor memory device according to the embodiment.

As illustrated in FIG. 5A, the sacrificial layer SCN is removed through the slits ST. Therefore, a void GP is formed in the portion where the sacrificial layer SCN has existed, that is, between the conductive layer DSC and the dielectric layer SGO. At this time, the structure of the dielectric layer SGO, the conductive layer SGP, the stacked body ON and the like as the upper layers is in a state of being supported by the protrusions PRO of the conductive layer DSC. In addition, the lower ends of the channels CH covered with the memory layers M are in a state of protruding into the void GP.

Figure 5B:
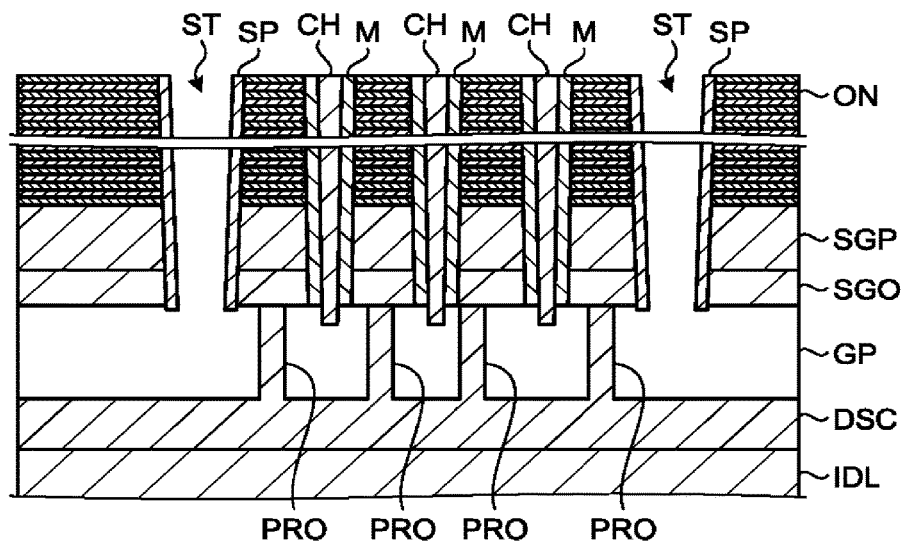
FIG. 5B is a cross-sectional view illustrating an example of the procedure of the processes of manufacturing the semiconductor memory device according to the embodiment.

As illustrated in FIG. 5B, the memory layers M at the lower ends of the channels CH protruding into the void GP are removed through the slits ST. Therefore, the memory layers M are removed from the side surfaces and the bottom surfaces of the portions of the channels CH protruding into the void GP, and the lower ends of the channels CH are in a state of being exposed.

Figure 5C:
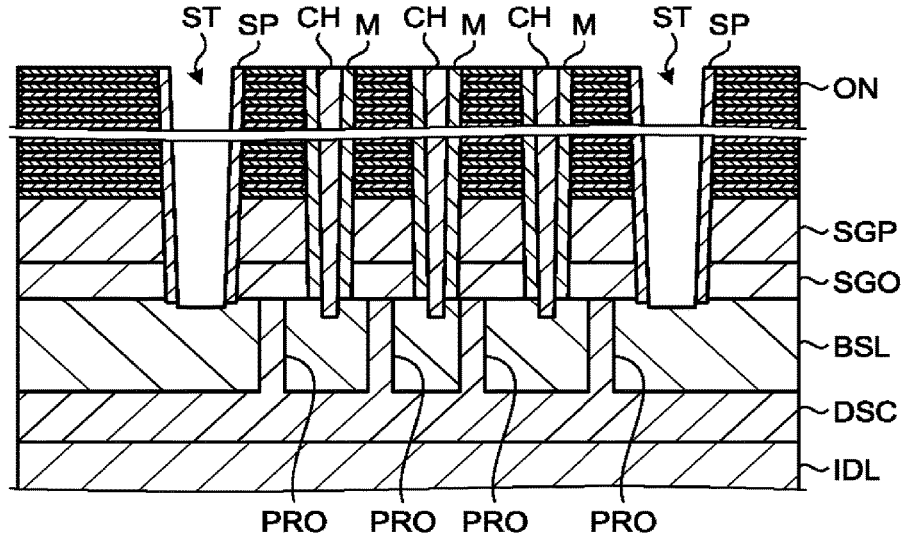
FIG. 5C is a cross-sectional view illustrating an example of the procedure of the processes of manufacturing the semiconductor memory device according to the embodiment.

As illustrated in FIG. 5C, the void GP is filled with the conductive material through the slits ST, so that the conductive layer BSL is formed. Therefore, the exposed lower ends of the channels CH are in a state of protruding into the conductive layer BSL. Accordingly, the channels CH and the conductive layers DSC and BSL are electrically conducted.

Figure 6A:
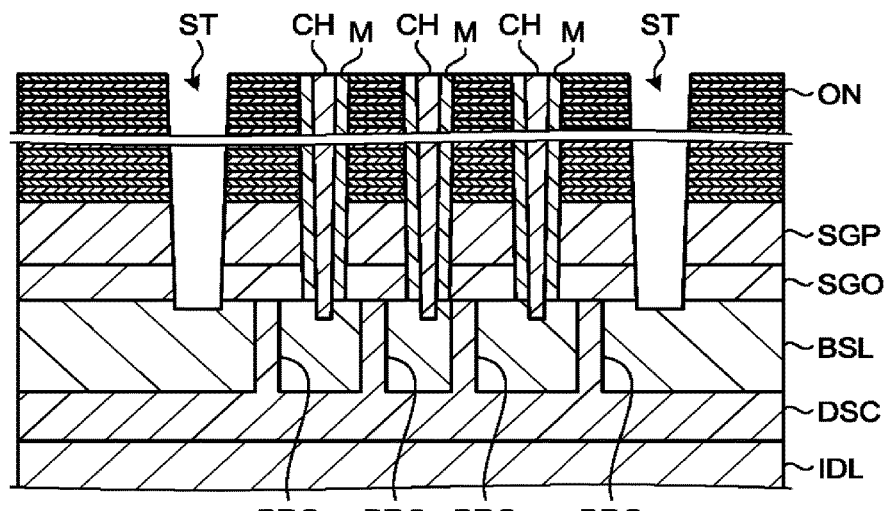
FIG. 6A is a cross-sectional view illustrating an example of the procedure of the processes of manufacturing the semiconductor memory device according to the embodiment.

As illustrated in FIG. 6A, the spacer layers SP on the inner walls of the slits ST are removed. However, when the memory layers M are removed, the spacer layers SP may be removed together.

Figure 6B:
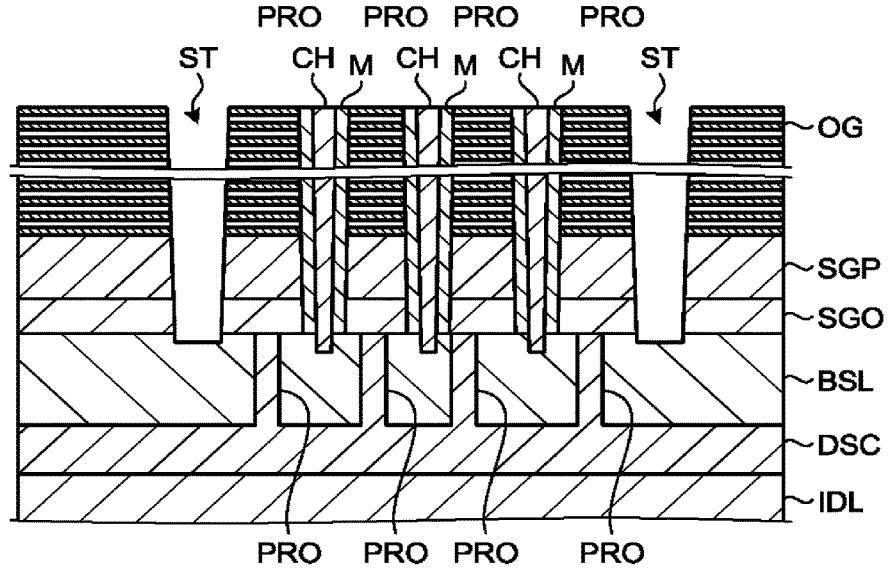
FIG. 6B is a cross-sectional view illustrating an example of the procedure of the processes of manufacturing the semiconductor memory device according to the embodiment.

As illustrated in FIG. 6B, the sacrificial layer constituting the stacked body ON is removed through the slits ST. Therefore, a void is formed in the portion where the sacrificial layer has existed, that is, between the dielectric layers. At this time, since the individual dielectric layers are connected to the memory layers M, the stacked body OG configured with the dielectric layers is in a state of being supported by the pillar-shaped structures including the channels CH.

Figure 6C:
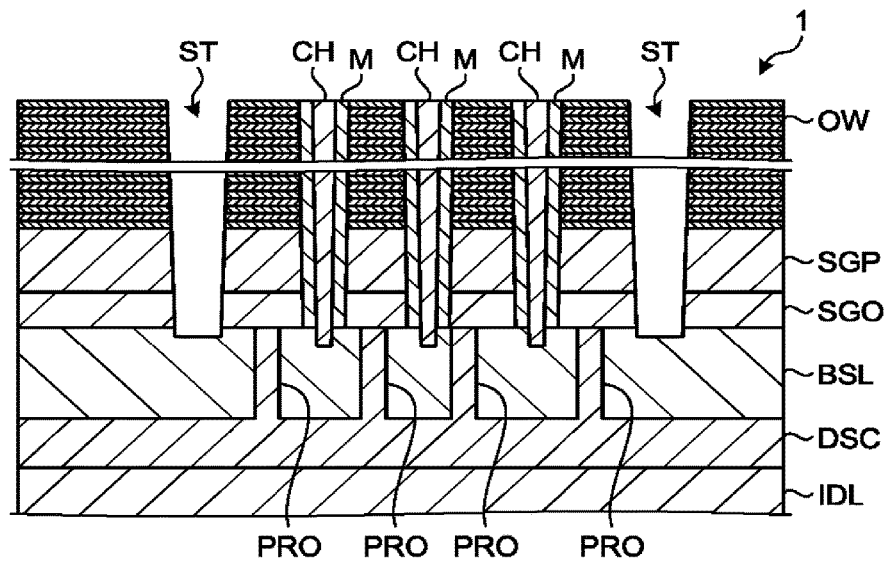
FIG. 6C is a cross-sectional view illustrating an example of the procedure of the processes of manufacturing the semiconductor memory device according to the embodiment.

As illustrated in FIG. 6C, the void formed by removing the sacrificial layer is filled with a conductive material or the like through the slits ST, and thus, a conductive layer to be stacked between the dielectric layers is formed. Therefore, a stacked body OW in which a plurality of dielectric layers and conductive layers are alternately stacked is formed.

After that, a dielectric material may be buried in the slits ST. Alternatively, the side surfaces of the slits ST may be covered with the dielectric material, and the slits ST inside the dielectric material may be buried with a conductive material to function as wire lines.

As a result, the semiconductor memory device 1 is manufactured.

Comparative Example

A NAND type flash memory having a three-dimensional structure includes pillar-shaped channels covered with, for example, a memory layer. A conductive layer functioning as a source line, for example, is arranged under the channel. However, the memory layer is formed by burying the memory hole penetrating through the stacked body of the dielectric layer and the conductive layer with a dielectric material or the like, and thus, the lower end of the channel to be connected to the conductive layer which is the source line is also covered. Therefore, how to connect the channel covered with the memory layer to the lower conductive layer becomes an issue.

In the processes of manufacturing the semiconductor memory device 1 according to the embodiment, a portion of the conductive layers DSC and BSL serving as source lines is formed by the sacrificial layer SCN, and the channels CH covered with the memory layers M are set to protrude into the sacrificial layer SCN. Then, when replacing the sacrificial layer SCN with the conductive layer BSL, the memory layers M at the lower ends of the channels CH are removed. Therefore, it is possible to obtain the channels CH protruding into the conductive layer BSL and allowing the side surface and the bottom surface of the protruding portion to be connected to the conductive layer BSL. In this manner, it is possible to configure the channels CH having a strong connection to the conductive layer BSL by simple and highly stable processes.

Herein, a new issue arises as to what kind of material is used as the sacrificial layer, and how to support the void to be formed by removing the sacrificial layer. The inventors have firstly considered using polysilicon as a sacrificial layer. In addition, the inventors have considered allowing the channels to reach the lower conductive layer and support the void formed by the sacrificial layer by the channels.

Figure 7A:
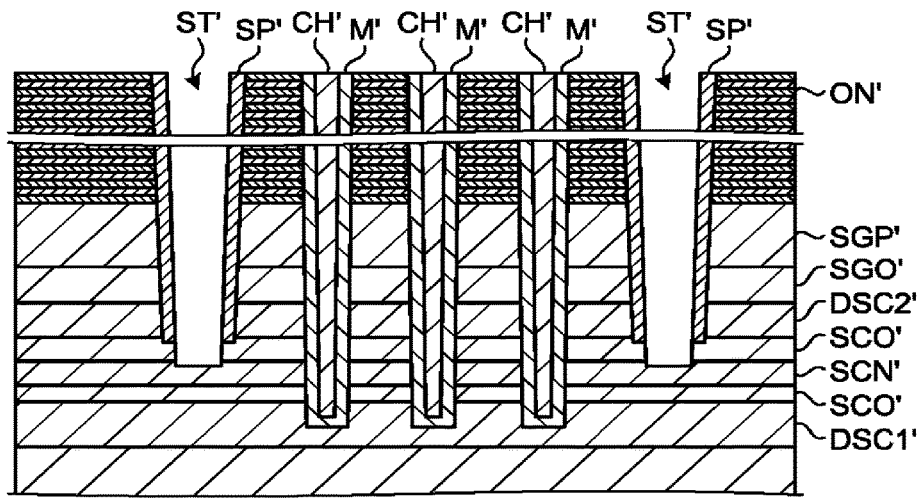
FIG. 7A is a cross-sectional view illustrating an example of a procedure of processes of manufacturing a semiconductor memory device according to Comparative Example.
Figure 7B:
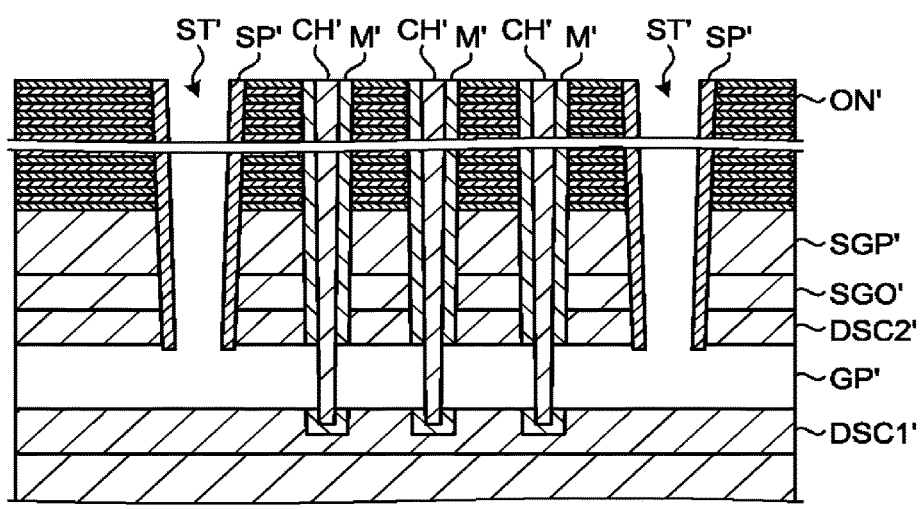
FIG. 7B is a cross-sectional view illustrating an example of the procedure of the processes of manufacturing the semiconductor memory device according to Comparative Example.
Figure 7C:
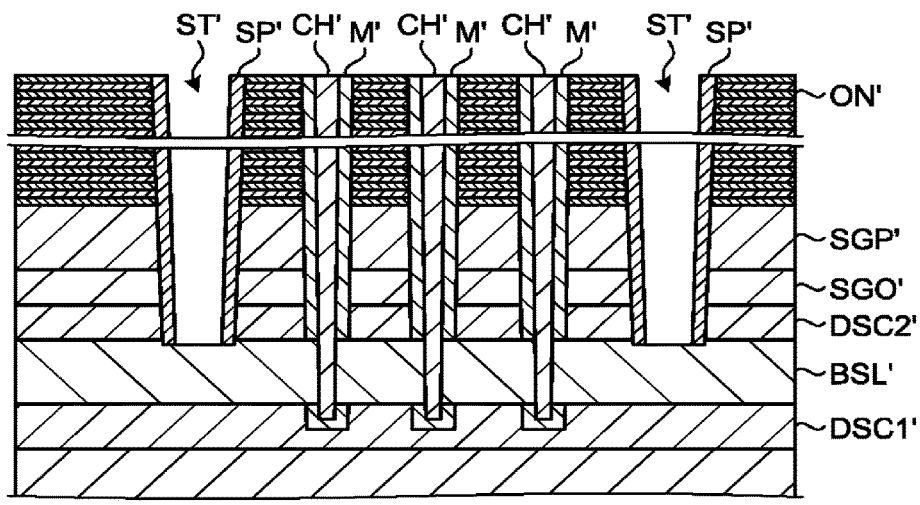
FIG. 7C is a cross-sectional view illustrating an example of the procedure of the processes of manufacturing the semiconductor memory device according to Comparative Example.

FIGS. 7A to 7C illustrate an example of the procedure of the processes of manufacturing the semiconductor memory device according to Comparative Example having such a configuration. As illustrated in FIG. 7A, lower conductive layers DSC 1' and DSC 2' serving as source lines were divided into upper and lower layers, and a sacrificial layer SCN' interposed between dielectric layers SCO' such as SiO$_2$ was arranged therebetween. Then, memory holes were penetrated down to the conductive layer DSC' to form channels CH' and memory layers M' reaching the conductive layer DSC'. In addition, slits ST' having spacers SP' such as SiN reaching the sacrificial layer SCN' were formed. As illustrated in FIG. 7B, the sacrificial layer SCN' was removed through the slits ST', and the memory layers M' were further removed. At this time, the dielectric layers SCO' arranged above and below the sacrificial layer SCN' were also removed to form a void GP'. As illustrated in FIG. 7C, the void GP' was filled with a conductive material through the slits ST' to form the source line configured with the conductive layers DSC 1', BSL', and DSC 2'.

However, in a case where the polysilicon sacrificial layer SCN' is used, the dielectric layer SCO' for protecting the upper and lower conductive layers DSC 1' and DSC 2' is required, so that the structure is complicated. In addition, if the spacer SP' of the slit ST' does not completely cover the side wall of the slit ST', there is a concern that the conductive layers DSC 2', SGP', and the like may be removed when the sacrificial layer SCN' is removed. In addition, in order to allow the conductive layers DSC 1', BSL', and DSC 2' to function as source lines, the dielectric layers SCO' above and below the sacrificial layer SCN' are required to be reliably removed.

In addition, the memory holes penetrating through the conductive layer DSC 2', the dielectric layer SCO', the sacrificial layer SCN' and the dielectric layer SCO' and reaching the conductive layer DSC 1' are required to be formed, so that an etching process with a high aspect ratio is required. On the other hand, the slits ST' are required not to penetrate through the sacrificial layer SCN', and an etching process with a high aspect ratio and a high selectivity is required. Furthermore, if the openings of the bottom surfaces of the slits ST' are not secured, it is difficult to bury the conductive layer BSL'.

In the processes of manufacturing the semiconductor memory device 1 according to the embodiment, a sacrificial layer SCN made of a material of SiN or the like different from the conductive layers DSC and SGP is used. Therefore, the sacrificial layer SCN can be selectively removed while suppressing the removal of the conductive layer DSC even without the dielectric layer SCO'. There is no concern that the conductive layer SGP is removed. In addition, the slits ST can be formed by selectively stopping etching with the sacrificial layer SCN by etching the dielectric layer SGO, so that an advanced etching process with a high aspect ratio and a high selectivity are not required.

In the processes of manufacturing the semiconductor memory device 1 according to the embodiment, the protrusions PRO are provided in the sacrificial layer SCN. Therefore, the void GP formed by removing the sacrificial layer SCN can be supported by the protrusions PRO. Therefore, for example, there is no need to form a memory hole with a high aspect ratio reaching the conductive layer DSC. In other words, the etching time of the memory holes MH can be reduced, and thus, the throughput is improved.

In the processes of manufacturing the semiconductor memory device 1 according to the embodiment, the diameter of the bottom surface of the memory hole MH is set to be larger than the diameter of the upper surface of the protrusion PRO. Therefore, it is possible to prevent the channel CH formed in the memory hole MH and the protrusion PRO from completely overlapping each other. Therefore, the channel CH and the conductive layers DSC and BSL can be more reliably conducted to each other.

In the processes of manufacturing the semiconductor memory device 1 according to the embodiment, the width of the bottom surface of the slit ST is formed so as to have a size larger than the height of the protrusion PRO included in the conductive layer DSC. Herein, the thickness of the conductive material to be filled through the slit ST is substantially equal to the height of the protrusion PRO. By allowing the width of the bottom surface of the slit ST to be larger than the height of the protrusion PRO, in principle, it is possible to fill the void GP with the conductive material before the opening of the slit ST is blocked. When the slit ST is formed, an advanced etching process with a high aspect ratio and a high selectivity is not required, so that it is easy to secure the opening of the slit ST in this way. In addition, while suppressing the bowing shape where the side wall of the slit ST becomes a bow, it is easy to secure the opening.

First Modified Example

Next, a semiconductor memory device according to a first modified example of the embodiment will be described with reference to FIGS. 8A to 8D. FIGS. 8A to 8D are cross-sectional views illustrating an example of the procedure of the processes of manufacturing the semiconductor memory device according to the first modified example of the embodiment. The semiconductor memory device according to the first modified example is different from the semiconductor memory device of the embodiment in terms of the method of forming protrusions PROa.

Figure 8A:
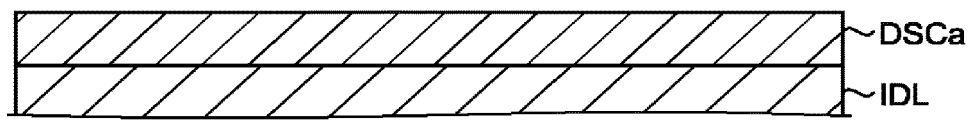
FIG. 8A is a cross-sectional view illustrating an example of a procedure of processes of manufacturing a semiconductor memory device according to a first modified example of the embodiment.

As illustrated in FIG. 8A, a conductive layer DSCa made of polysilicon or the like is formed on the interlayer dielectric layer IDL covering the peripheral circuit. At this time, the thickness of the conductive layer DSCa is set to a thickness not including the protrusions PROa to be formed later. That is, the conductive layer DSCa is formed to be thinner than the conductive layer DSC (refer to FIG. 2A) of the embodiment.

Figure 8B:
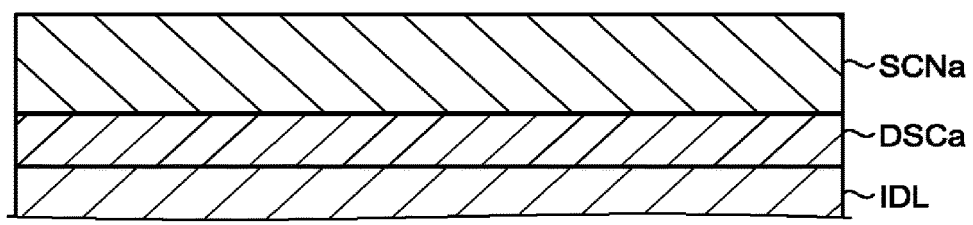
FIG. 8B is a cross-sectional view illustrating an example of the procedure of the processes of manufacturing the semiconductor memory device according to the first modified example of the embodiment.

As illustrated in FIG. 8B, a sacrificial layer SCNa is formed on the conductive layer DSCa. The sacrificial layer SCNa is a dielectric layer that can be replaced with polysilicon or the like of the conductive layer to constitute a portion of the source line later and is made of, for example, SiN or the like.

Figure 8C:
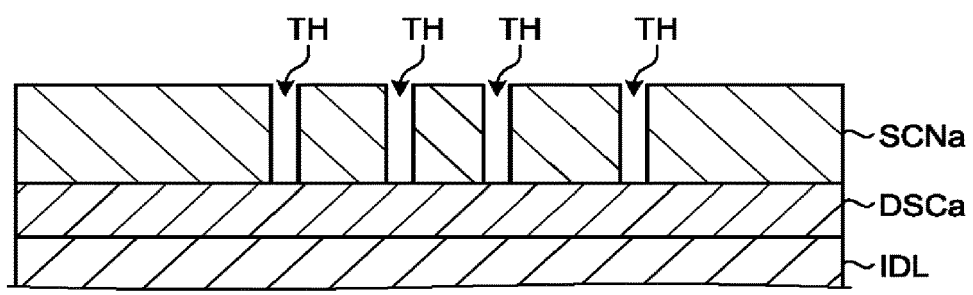
FIG. 8C is a cross-sectional view illustrating an example of the procedure of the processes of manufacturing the semiconductor memory device according to the first modified example of the embodiment.

As illustrated in FIG. 8C, a through hole TH is formed in the sacrificial layer SCNa. The through hole TH can be formed, for example, by forming a resist pattern (not illustrated) having holes on the sacrificial layer SCNa and etching the sacrificial layer SCNa with the resist pattern as a mask.

Figure 8D:
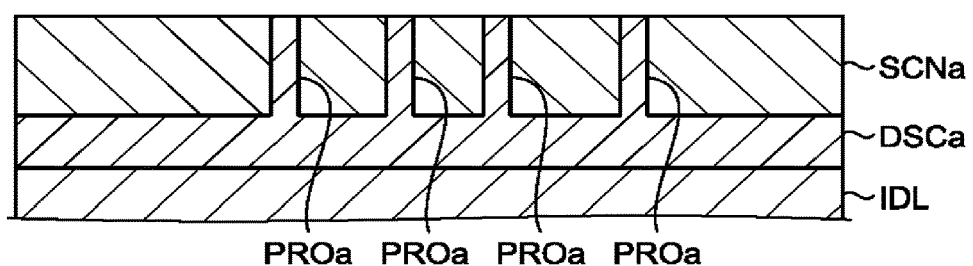
FIG. 8D is a cross-sectional view illustrating an example of the procedure of the processes of manufacturing the semiconductor memory device according to the first modified example of the embodiment.

As illustrated in FIG. 8D, by filling the through holes TH of the sacrificial layer SCNa with the same type of conductive material as the conductive layer DSCa, the protrusions PROa are formed in the sacrificial layer SCNa.

Second Modified Example

Figure 9A:
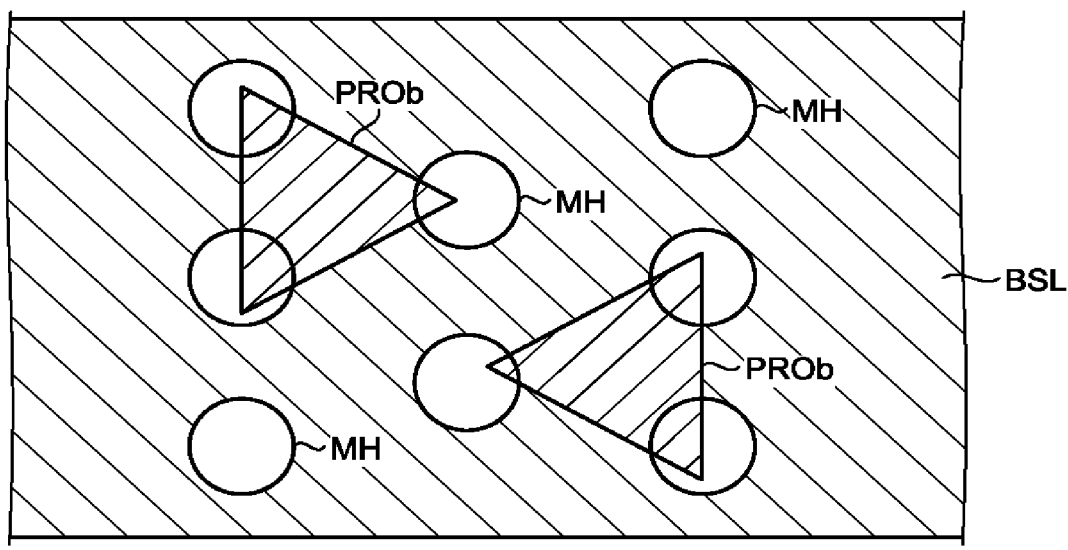
FIG. 9A is a cross-sectional view taken in a direction along a semiconductor substrate illustrating protrusions included in a semiconductor memory device according to a second modified example of the embodiment.
Figure 9B:
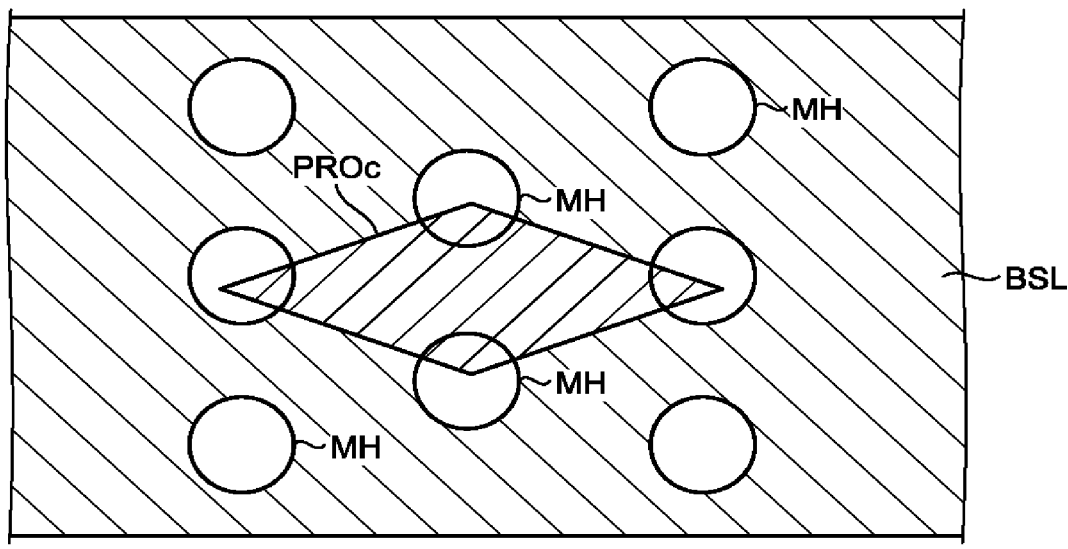
FIG. 9B is a cross-sectional view taken in the direction along the semiconductor substrate illustrating protrusions included in the semiconductor memory device according to the second modified example of the embodiment.

Next, a semiconductor memory device according to a second modified example of the embodiment will be described with reference to FIGS. 9A and 9B. FIGS. 9A and 9B are cross-sectional views taken in a direction along the semiconductor substrate SUB illustrating protrusions PROb and PROc included in the semiconductor memory device according to the second modified example of the embodiment. The semiconductor memory device of the second modified example is different from the semiconductor memory device of the embodiment in terms of the shapes of the protrusions PROb and PROc.

As illustrated in FIG. 9A, the protrusion PROb has a triangular shape of which three vertices overlap with the memory holes MH in a top view, respectively. Even in this case, the protrusion PROb and the memory hole MH may not be completely overlapped with each other, and the channel to be formed in the memory hole MH later can be conducted to the conductive layer serving as the source line.

As illustrated in FIG. 9B, the protrusion PROc has a diamond shape of which four vertices overlap with the memory holes MH in a top view. Even in this case, the protrusion PROc and the memory hole MH may not be completely overlapped, and the channel to be formed in the memory hole MH later can be conducted to the conductive layer serving as the source line.

As described above, the protrusions can take any shape and arrangement as long as the protrusions do not completely overlap with the memory holes.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
    a substrate;
    a first conductive layer arranged above the substrate;
    a stacked body arranged on the first conductive layer with a plurality of dielectric layers and a plurality of second conductive layers being alternately stacked;
    a pillar-shaped channel extending in a stacking direction of the stacked body, penetrating through the stacked body, and protruding into the first conductive layer; and
    a memory layer covering a side surface of the channel,
    wherein a bottom surface of the channel and the side surface of the channel protruding into the first conductive layer are in contact with the first conductive layer, and
    wherein the first conductive layer includes:
    an upper layer; and
    a lower layer having a protrusion penetrating through the upper layer.

2. The semiconductor memory device according to claim 1, wherein the bottom surface of the channel and an upper surface of the protrusion are arranged so as not to overlap with each other at least completely in a top view.

3. The semiconductor memory device according to claim 1, wherein the bottom surface of the channel is arranged at a position with at least a portion thereof protruding from the upper surface of the protrusion in a top view.

4. The semiconductor memory device according to claim 2, wherein a size of the bottom surface of the channel is larger than a size of the upper surface of the protrusion.

5. The semiconductor memory device according to claim 4,
    wherein the channels include a first channel and a second channel, and
    wherein the protrusion is arranged between the first channel and the second channel in a top view.

6. The semiconductor memory device according to claim 3, wherein a size of the bottom surface of the channel is smaller than a size of the upper surface of the protrusion.

7. The semiconductor memory device according to claim 6,
wherein the channels include a first channel and a second channel, and
wherein the protrusion is arranged across the first channel and the second channel in a top view.

8. The semiconductor memory device according to claim 1, further comprising a slit extending in a stacking direction of the stacked body and penetrating through the stacked body to reach the first conductive layer,
wherein a size of a bottom surface of the slit in a width direction is larger than a size of a height of the protrusion.

9. The semiconductor memory device according to claim 8, wherein the lower layer of the first conductive layer is a layer formed by replacing a dielectric material with a conductive material through the slit.

10. The semiconductor memory device according to claim 1, further comprising a transistor arranged on the substrate,
wherein the first conductive layer is arranged above the transistor.

* * * * *